United States Patent
Bilan et al.

(10) Patent No.: US 11,516,943 B2
(45) Date of Patent: Nov. 29, 2022

(54) DIRECT LIQUID COOLING SYSTEM FOR COOLING OF ELECTRONIC COMPONENTS

(71) Applicant: Inpro Technologies Limited Liability Company, Moscow (RU)

(72) Inventors: Alexey Petrovich Bilan, Moscow (RU); Viktor Yurievich Zhilko, Moscow (RU); Viktor Mikhailovich Kaufman, Moscow (RU); Alexander Nikolaevich Nikitin, Moscow (RU)

(73) Assignee: INPRO TECHNOLOGIES LIMITED LIABILITY COMPANY, Moscow (RU)

( * ) Notice: Subject to any disclaimer, the term of this patent is extended or adjusted under 35 U.S.C. 154(b) by 37 days.

(21) Appl. No.: 16/956,861

(22) PCT Filed: Dec. 28, 2017

(86) PCT No.: PCT/RU2017/000998
§ 371 (c)(1),
(2) Date: Jun. 22, 2020

(87) PCT Pub. No.: WO2019/132696
PCT Pub. Date: Jul. 4, 2019

(65) Prior Publication Data
US 2020/0323108 A1 Oct. 8, 2020

(30) Foreign Application Priority Data
Dec. 26, 2017 (RU) .......................... RU2017145714

(51) Int. Cl.
*H05K 7/20* (2006.01)
*F28F 9/22* (2006.01)
(Continued)

(52) U.S. Cl.
CPC .......... *H05K 7/20781* (2013.01); *F28F 9/22* (2013.01); *F28F 27/00* (2013.01); *H05K 7/1488* (2013.01);
(Continued)

(58) Field of Classification Search
None
See application file for complete search history.

(56) References Cited

U.S. PATENT DOCUMENTS

| 4,590,538 A | 5/1986 | Cray, Jr. |
| 5,167,511 A | 12/1992 | Krajewski |

(Continued)

FOREIGN PATENT DOCUMENTS

| EP | 3177125 A2 | 6/2017 |
| WO | WO-2014/109869 A1 | 7/2014 |

*Primary Examiner* — Courtney L Smith
(74) *Attorney, Agent, or Firm* — Muncy, Geissler, Olds & Lowe, P.C.

(57) ABSTRACT

The present disclosure is directed to a direct liquid cooling system for cooling of electronic components and configured to maintain a predetermined thermostable environment for the electronic components. The system includes a reservoir and a rack removably placed in the reservoir and securely containing electronic components to be cooled. The system also includes a dielectric coolant which is configured to flow upward in parallel streams between the electronic components and a pump that facilitates continuous pumping of the dielectric coolant thereby forcing the dielectric coolant upwards through the electronic components and overflowing the dielectric coolant within the reservoir. A heat exchanger is also provided and coupled with the reservoir via an outlet pipeline. Additionally, a controller is provided to monitor the temperature of the dielectric coolant and adjust the flow of the coolant.

11 Claims, 8 Drawing Sheets

(51) Int. Cl.
*F28F 27/00* (2006.01)
*H05K 7/14* (2006.01)

(52) U.S. Cl.
CPC ..... *H05K 7/20272* (2013.01); *H05K 7/20281* (2013.01)

(56) References Cited

U.S. PATENT DOCUMENTS

| | | | |
|---|---|---|---|
| 10,863,649 B2* | 12/2020 | Chen | H05K 7/20781 |
| 2015/0043165 A1* | 2/2015 | Best | G06F 1/20 |
| | | | 361/699 |
| 2016/0014932 A1* | 1/2016 | Best | G06F 1/20 |
| | | | 361/679.53 |
| 2016/0234970 A1* | 8/2016 | Shelnutt | F28D 15/02 |
| 2017/0064862 A1* | 3/2017 | Miyoshi | H01L 21/67109 |
| 2017/0156233 A1* | 6/2017 | Moss | H05K 7/20763 |
| 2017/0303443 A1* | 10/2017 | Inano | G06F 1/206 |
| 2017/0354066 A1* | 12/2017 | Kodama | H05K 7/20236 |
| 2018/0020571 A1* | 1/2018 | Saito | H05K 7/20 |
| 2018/0084671 A1* | 3/2018 | Matsumoto | H05K 7/20772 |
| 2018/0098464 A1* | 4/2018 | Ishinabe | H05K 7/20236 |
| 2018/0279507 A1* | 9/2018 | Midgley | H05K 7/20772 |

\* cited by examiner

DIRECT LIQUID COOLING SYSTEM FOR COOLING OF ELECTRONIC COMPONENTS

BACKGROUND OF THE INVENTION

Field of the Invention

The present disclosure relates to a cooling of electronic components, and in particular, to a direct liquid cooling system for cooling of electronic components, which is designed to create a predetermined thermostable environment for various electronic components.

Description of the Background Art

It is well known that heat is a major problem facing the computer and electronic industries. All electronic components produce heat, and in general the faster they process information, the more heat they produce.

It is known, the higher the temperature of operation of the electronic components, the shorter the components' life expectancy. Additionally, operation at high temperatures can cause power fluctuations and failures that lead to various errors within the computing and electronic systems. If the heat dissipation is not consistently managed heat will inevitably harm the structural and data integrity of the computing and electronic system.

It is also well known that the industry trend has been to continuously increase the number of electronic components inside the systems. Given the limited footprint of many computing and electronic systems, a continuous increase in the number of heat generating components within the limited space creates challenging heat related issues.

A variety of techniques are used for cooling enclosed electronic equipment to maintain a predetermined temperature range for the components included in the computing and electronic system. These techniques include providing ventilation in the enclosure to allow heat to escape, improving radiation properties of surfaces to increase the radiation of heat away from the equipment, adding fans to force cool air from outside, using liquid coolant flow through, for example, "cold plates" which are placed on hot components in the enclosure in order to remove heat from those components.

Currently two different cooling approaches are used in order to maintain the predetermined temperature range for the components included in the computing and electronic system, namely, pure air-cooled systems or hybrid-cooled systems. In pure air-cooled systems, all components are cooled by traditional air-cooled heat sinks. To sufficiently cool a few high power components, very high airflow rates and/or large and/or expensive heat sinks are needed. A high airflow rate is usually accomplished by using powerful high speed fans.

However, pure air-cooled systems have a high cost and noise impact, because of high cost associated with powerful high speed fans that operate at high noise levels.

As the packaging densities increase, the air cooling solutions are becoming more prohibitive, costly and ineffective. In addition, air cooling has other associated costs in the form of unwanted acoustic and energy consumption. Moreover, this approach is rising the dust accumulation within the enclosure which leads to the static electricity problems and radiation properties of surfaces degradation. In large "data centers" that house many computing and electronic systems in close proximity, the heat dissipation issue is aggravated even more. In such cases, cooling costs and feasibility of providing air cooling have become especially burdensome.

The term "data center" generally refers to a physical location housing one or more "servers". The term "server" generally refers to a computing device connected to a computing network and running software configured to receive requests from client computing components. Such servers may also include specialized computing components such as network routers, data acquisition equipment, movable disc drive arrays, and other components commonly associated with data centers.

Typical commercially-available servers have been designed for air cooling. Such servers usually comprise one or more printed circuit boards having a plurality of electrically coupled components mounted thereto. As describe above, these circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

"Racks" have been used to organize several servers. For example, several servers can be mounted within a rack, and the rack can be placed within a data center. Any of various computing components, such as, for example, network routers, hard-drive arrays, data acquisition equipment and power supplies, are commonly mounted within a rack.

Data centers housing such servers and racks of servers typically distribute air among the servers using a centralized fan or blower. As more fully described herein, air within the data center usually passes through a heat exchanger for cooling the air before entering a server. In some data centers, the heat exchanger has been mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heating generating components, the airflow speed and airflow path through the server and the packaging of each respective component, as well as a maximum allowable operating temperature of the respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

In general, a lower air temperature in a data center allows each server component to dissipate a higher power, and thus allows each server to dissipate more power and operate at a level of hardware performance. Consequently, data centers have traditionally used sophisticated air conditioning systems to cool the air within the data center for achieving a desired performance level. By some estimates, as much as one watt can be consumed to remove one watt of heat dissipated by an electronic component. Consequently, as energy costs and power dissipation continue to increase, the total cost of cooling a data center has also increased.

In addition, large-scale data centers have provided several cooling stages for cooling heat dissipating components. For example, a stream of coolant, e.g., water, can pass over an evaporator of a vapor-compression refrigeration cycle cooling system and be cooled to, for example. before being distributed through a data center for cooling air within the data center.

According to some estimates, some state-of-the-art data centers are capable of cooling only about 150 Watts-per-square-foot, as opposed to cooling the more than about 1,200 Watts-per-square-foot that could result from arranging servers to more fully utilize available volume (e.g., closely spacing servers and racks to more fully utilize floor-to-ceiling height and floor space) within existing data centers. Such a low cooling capacity can significantly add to the cost of building a data center, since data centers can cost as much as about $250 per-square-foot to construct.

As the air-cooling example implies, commercially available methods of cooling have not kept pace with increasing server and data-center performance needs, or the corresponding growth in heat density. As a consequence, adding new servers to existing data centers has become difficult and complex given the effort expended to facilitate additional power dissipation, such as by increasing an existing data center's air conditioning capacity.

Various alternative approaches for cooling data centers and their servers, e.g., using liquid cooling systems, have met with limited success. For example, attempts to displace heat from a microprocessor for remotely cooling the chip have been expensive and cumbersome. In these systems, a heat exchanger or other cooling device, has been placed in physical contact (or close physical relation using a thermal-interface material) with the package containing the chip. These liquid-cooled heat exchangers have typically defined internal flow channels for circulating a liquid internally of a heat exchanger body. However, component locations within servers can vary from server to server. Accordingly, these liquid-cooling systems have been designed for particular component layouts and have been unable to achieve large-enough economies of scale to become commercially viable.

Immersion cooling of electronic components has been attempted in high-performance applications, but has not enjoyed widespread commercial success. Previous attempts at immersion cooling has submerged some, and in some instances all, components mounted to a printed circuit board in a dielectric coolant using a hermetically sealed enclosure to contain the coolant. Such systems have been expensive, and offered by a limited number of suppliers.

U.S. Pat. No. 4,590,538, Cray, is an early example of an immersion system for cooling electronic components during normal operation. Cray describes the significant advantages resulting from using an electrically non-conductive or dielectric coolant to extract heat from electronic circuit assemblies during normal operation.

U.S. Pat. No. 5,167,511, Krajewski, et al., discloses another example of an immersion system for cooling electronic components during normal operation.

One particular problem in systems disclosed in the above references is the necessity of draining the cooling coolant whenever physical access to the electronic modules was required. In general, such an operation, besides being time consuming, requires the entire system to be switched off, especially if the component requiring attention is an essential element in the system architecture, such as the central processing unit ("CPU").

Accordingly, each method of server or computer cooling currently employed or previously attempted have been prohibitively expensive and/or insufficient to meet increasing cooling demands of computing components.

Therefore, there exists the need for an effective, efficient and low-cost cooling alternative for cooling electronic components, such as, for example, rack-mounted servers.

Furthermore, a solution is needed to make the server environments cost effective and energy efficient while providing heat dissipation solutions that can extend beyond current systems designs and can be practically applicable in fabrication of future generation environments.

It is, therefore, an object of this disclosure to disclose a system for direct liquid cooling of electronic components, which is designed to create a predetermined thermostable environment for various electronic components, such as rack-mounted servers or the like.

Yet another object of the present disclosure is to offer a cost effective system that allows for low operating costs and improved reliability. These objectives are achieved by disclosed herein direct cooling system, and in particular, the system comprising a reservoir configured to receive a retrievable rack that contains electronic components to be cooled. The system further configured to allow for parallel flows of dielectric coolant between the electronic components thereby facilitating cooling of the components.

SUMMARY OF THE INVENTION

In view of the foregoing and other exemplary problems, drawbacks, and disadvantages of the conventional methods and systems, an exemplary feature of the present invention is to improve a direct liquid cooling system for cooling of electronic components that is designed to provide a predetermined thermostable environment for the electronic components environments in a cost effective and energy efficient manner.

In accordance with a first exemplary, non-limiting aspect of the present invention the direct liquid cooling system for cooling of electronic components configured to maintain a predetermined thermostable environment for the electronic components, includes a reservoir, a rack having an upper portion and a lower portion, which are separated by a horizontally placed panel. The panel includes a plurality of guide openings or valves.

The rack is removably placed in the reservoir. The rack is configured to securely contain electronic components to be cooled.

The rack may also include T-shaped longitudinal grooves on side surfaces of the rack in order to facilitate securing of the electronic components and other equipment on the rack.

The system further includes a dielectric coolant. The coolant is configured to flow upward in parallel streams between the electronic components through at least one nozzle positioned at a bottom portion of the reservoir. The nozzle or nozzles are aligned with the guide openings of the horizontal panel that separates the upper and lower portions of the rack.

The system also has a pump assembly coupled with the at least one nozzle through an inlet pipeline that facilitates continuous pumping of the dielectric coolant thereby forcing the dielectric coolant upwards through the electronic components and overflowing the dielectric coolant.

A heat exchanger module is also provided and is coupled with the reservoir through an outlet pipeline. The outlet pipeline is coupled with an outlet port configured to receive the dielectric coolant overflow.

A system controller may be provided. The controller is configured to monitor the temperature of the dielectric coolant to determine the temperature difference within the system and adjusting the flow of the dielectric coolant through the electronic components in order to maintain the predetermined thermostable environment of the electronic components.

In addition, the system may include dielectric partitions that are placed via the T-shaped longitudinal grooves on the side surfaces of the rack. The partitions further provide separation of the coolant parallel flows and functional zones inside the reservoir.

By the terms "comprising," "having," "including," and "containing" as used herein, are meant that various additional components can be conjointly employed in the compositions of this invention.

Other features and advantages of the invention will appear from the following description in which the preferred embodiments have been set forth in detail in conjunction with the accompanying drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

"Electronic components" as used in this disclosure can be a stand alone computer processor having high, mid or low end processing capability. In one embodiment, electronic components may comprise multiple electronic system chassis, each having multiple heat generating components or blades disposed therein requiring cooling. As one example, an electronic system chassis may be a multi-blade center server system. The blades or subsystems of each multi-blade center server system may be removable, and comprise multiple different types of components to be liquid-cooled.

According to the present invention any electronic component, such as blade, book, node, or the like having multiple different types of components is directly cooled by common immersion within coolant flowing through or across the components. In one instance, one or more surfaces of each component of the multiple different types of components is in direct physical contact with the coolant to facilitate transfer of heat from the component to the coolant.

Figure 1:
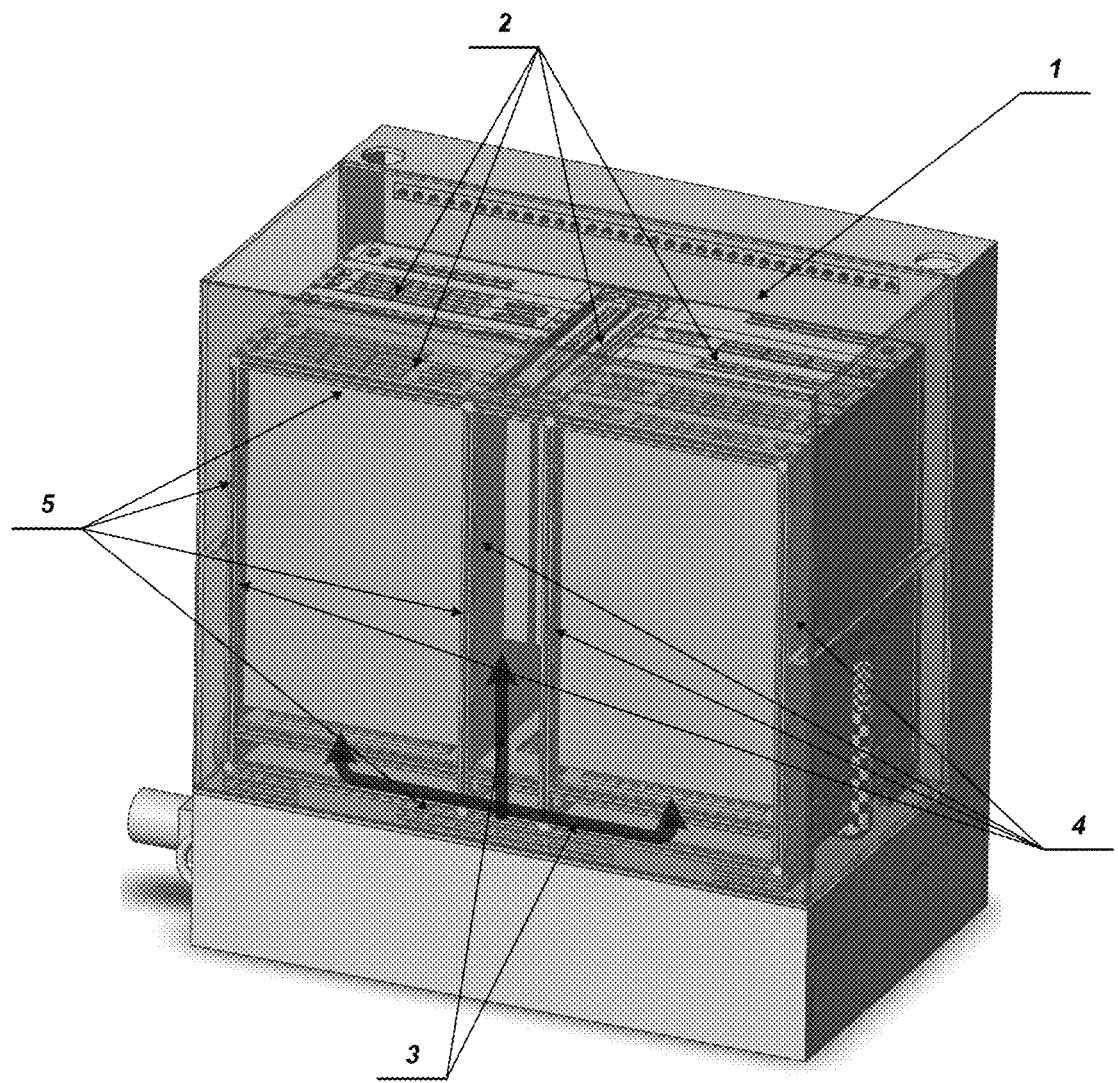
FIG. 1 is a representation of a direct liquid cooling system for cooling of electronic components according to the present disclosure.
Figure 2:
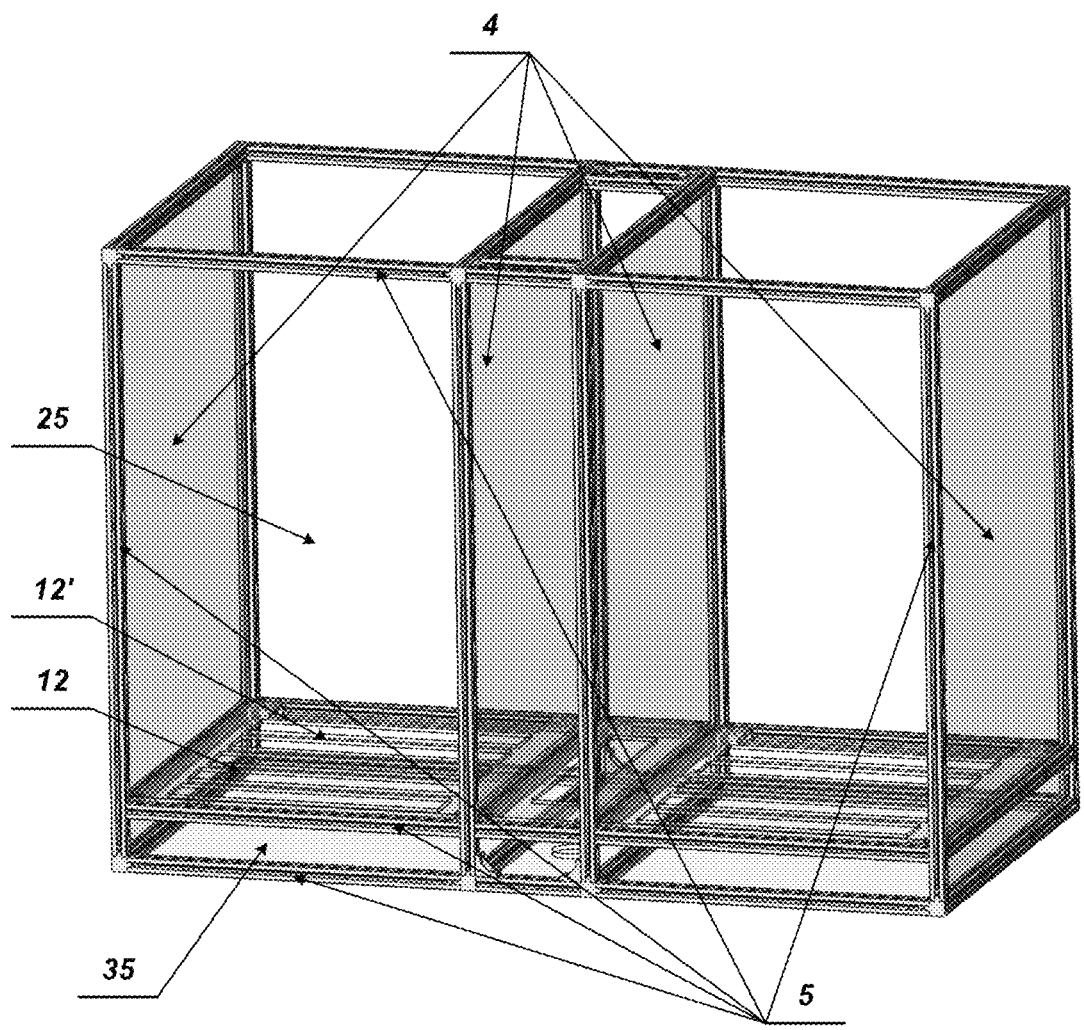
FIG. 2 is a representation of a rack of the direct liquid cooling system for cooling of electronic components according to the present disclosure.
Figure 3:
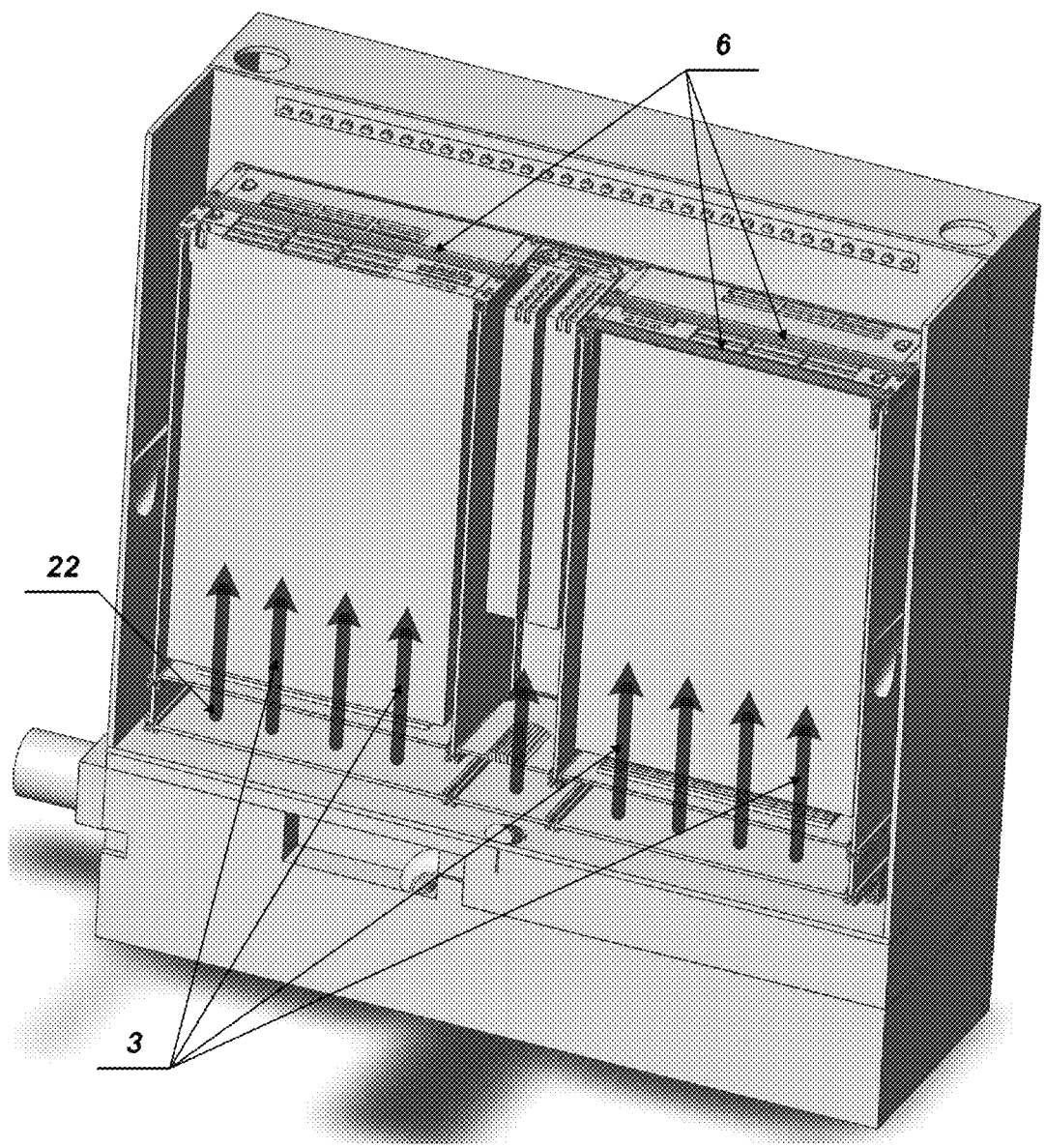
FIG. 3 is a representation of the direct liquid cooling system for cooling of electronic components according to another embodiment of the present disclosure.

Referring to FIGS. 1 to 3, a direct liquid cooling system for cooling of electronic components (2) configured to maintain a predetermined thermostable environment for the electronic components, includes a reservoir (1) and a rack (5).

The reservoir (1) is adapted to receive the rack (5) that contains electronic components to be cooled. The reservoir may also have a removable cover (not shown). The cover may be hinged on one side of a wall of the reservoir.

According to an embodiment of the present invention, a dielectric coolant flows upward in parallel streams (3). The dielectric coolant facilitates transfer of heat from the electronic components placed in the rack (5) within the reservoir (1).

Dielectric coolant that can be used in this type of direct cooling system include, but are not limited to engineered fluids like 3M™ Novec™, Mineral oil, Silicone oil, Natural ester-based oils, including soybean-based oils, and Synthetic ester-based oils.

The rack (5) preferably has T-shaped longitudinal grooves on side surfaces of the rack (5) in order to facilitate mounting the electronic components (2) and other equipment to be cooled. It has been determined that the T-shaped longitudinal grooves facilitate a secure and reliable mounting of the electronic components (2) as well as other equipment.

In addition, a locking mechanism (not shown) or suitable mounting members (not shown) may be provided in conjunction with the T-shaped longitudinal grooves for securing the electronic components (2). It should be understood that any other known configuration that allows for a secure mounting of components (for example, can also be used in connection with the present invention.

The rack (5) is configured to be removably placed within the reservoir (1). This allows for easy access to the electronic equipment in an event of maintenance and/or repair. In addition, this configuration allows for easy substation and/or addition of the components of the electronic equipment.

Various methods of removably securing the rack (5) within the reservoir (1) can be used. For example, known methods include bolting the rack (5) to predetermined welded sockets of the reservoir (1), using pressure to connect the rack (5) to the walls of the reservoir (1), or using self-locking mechanisms.

In an embodiment of the present invention, the rack (5) also houses dielectric partitions (4). The dielectric partitions (4) provide further separation of the coolant flows and functional zones inside the reservoir (1). The T-shaped longitudinal grooves are used in order to secure the dielectric partitions (4) as illustrated in FIG. 2. The dielectric partitions (4) facilitate the parallel and unified nature of the parallel streams (3), thereby amplifying uniformity and consistency of the cooling of the electronic components (2).

In order to improve the effectiveness of the parallel streams (3) through the electronic components (2), it is preferable to employ a filler element (6) or a plurality of the filler elements (6) in order to plug the unused spaces for mounting the electronic equipment (2) as illustrated in FIG. 3.

Preferably, the filler element (6) is in the form of the overlapping flow plate or, alternatively, in the form of the displacement element, which allows for the reduction of the amount of the dielectric coolant within the reservoir (1) when the rack (5) is not fully filled with the electronic equipment (2), while still maintaining the electronic components (2) immersion-cooled.

In an embodiment of the present invention, the filler element (6) may fills up to 50% of the reservoir's internal space, thereby reducing a maximum amount of the dielectric coolant utilized within the container at any time. Advantageously, the filler element (6) reduces the amount of dielectric coolant required within the reservoir (1), while still maintaining the multiple different types of electronic components (2) immersion-cooled by the coolant.

In one embodiment of the present invention, the filler element (6) is shaped and configured to direct dielectric coolant flow through the reservoir (1) by, for example, defining one or more parallel streams (3) of the dielectric coolant.

Referring to FIG. 2, the rack (5) has an upper portion (25) and a lower portion (35). The upper portion (25) and the lower portion (35) are separated by a horizontally placed dielectric panel (12).

According to one embodiment of the present invention, the dielectric panel (12) comprises of a plurality of dielectric panels (12'). The dielectric panel (12) or the plurality of dielectric panels (12') include at least one guide opening (22), and preferably a plurality of guide openings (22), as illustrated on FIG. 3. The guide opening (22) may also include a guide valve directing and adjusting the flow of the coolant.

Figure 4:
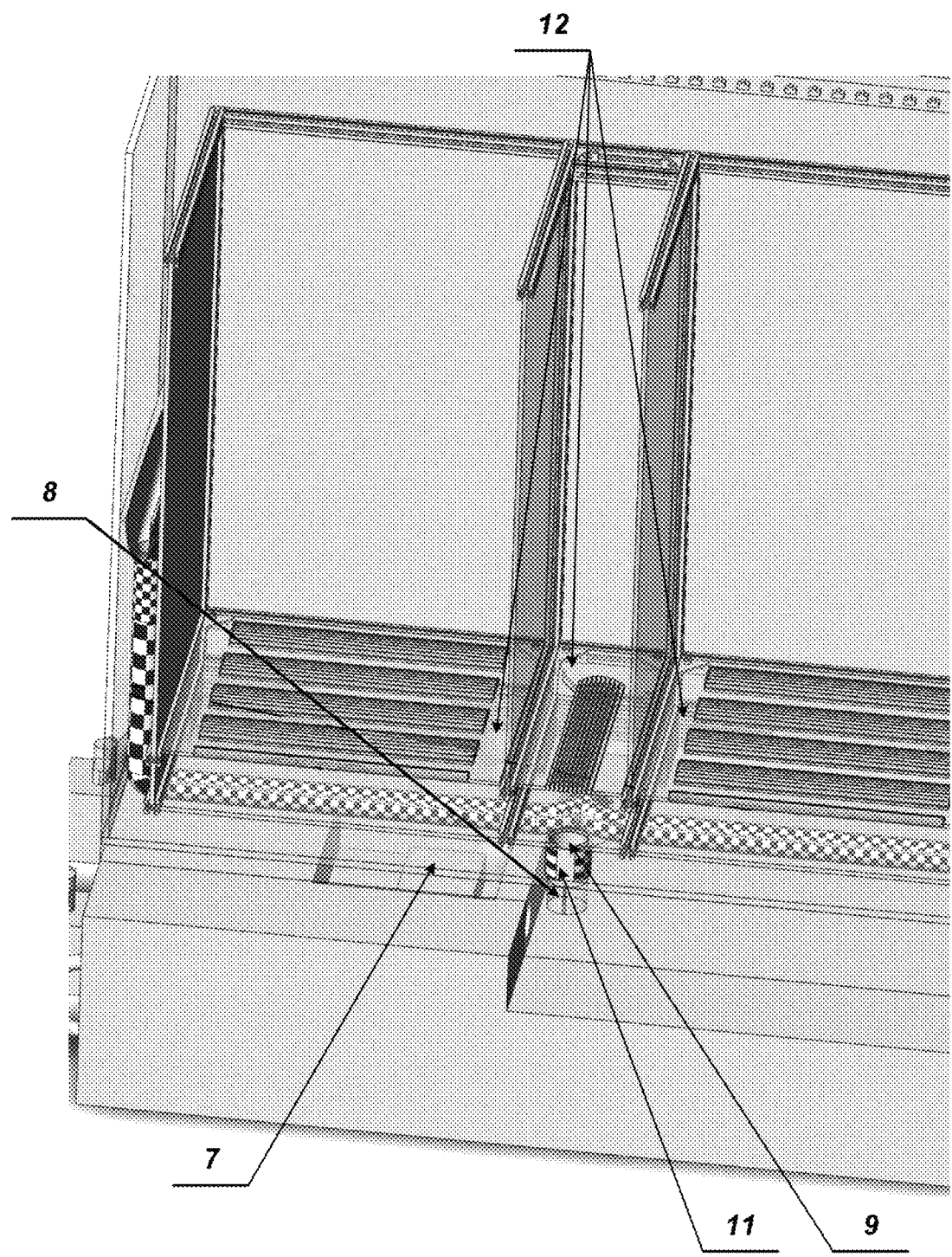
FIG. 4 is a representation of a nozzle and an inlet pipeline of the direct liquid cooling system for cooling of electronic components according to the present disclosure.

Referring to FIG. 4, the dielectric coolant is configured to flow upward in parallel streams (3) between the electronic components (2) through at least one nozzle (9) positioned at the lower portion (35) at a bottom of the reservoir (1). The nozzle (9) is aligned with the guide opening (22) of the dielectric panel (12).

The nozzle (9) is coupled to an inlet pipeline (8) as shown in FIG. 4. The coupling of the nozzle (9) with the guide opining (22) can be facilitated, for example, by corrugated bushing (11) in order to insure a proper alignment. It is understood that preferably a plurality of the nozzles (9) is provided.

The dielectric coolant is supplied in the upward direction through a pump assembly (7) coupled with the at least one nozzle (9) through the inlet pipeline (8).

Figure 5:
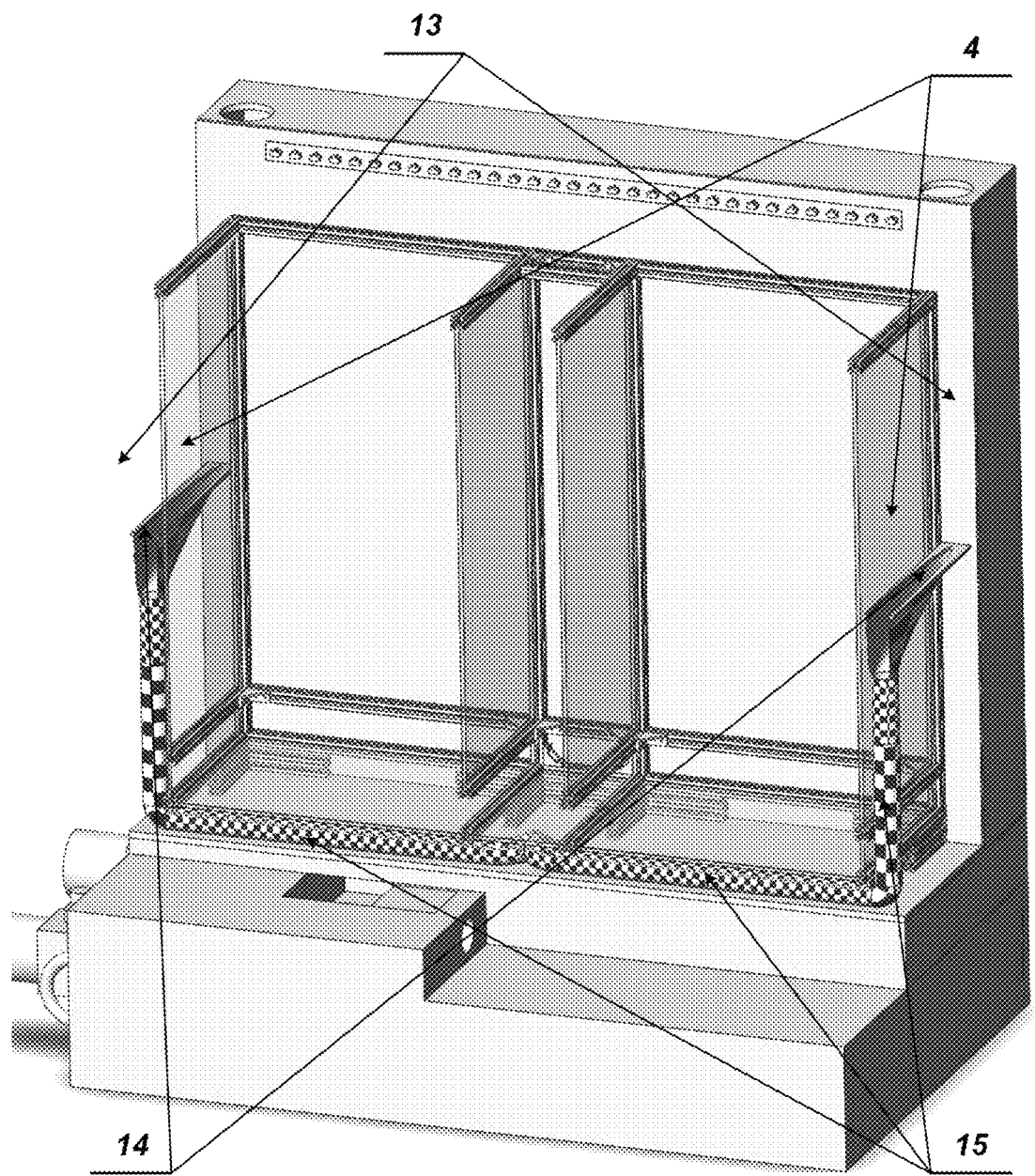
FIG. 5 a representation of an outlet and an outlet port of the direct liquid cooling system for cooling of electronic components according to the present disclosure.

Referring to FIG. 4, the pump assembly (7) facilitates continuous pumping of the dielectric coolant thereby forcing the dielectric coolant upwards through the electronic components (2). Continues supply of the dielectric coolant as described herein results in the overflow as shown in FIG. 5. The overflow moves in downward direction through an overflow zone (13) that is formed by a wall of the reservoir (1) and the dielectric partition (4).

As illustrated in FIG. 5, the overflow zone (13) includes an outlet port (14) that is coupled with an outlet pipeline (15). The outlet port (14) is configured to receive substantially the entire dielectric coolant overflow. In other words, the dimensions of the outlet port (14) are the same as that of the overflow zone (13).

Figure 6:
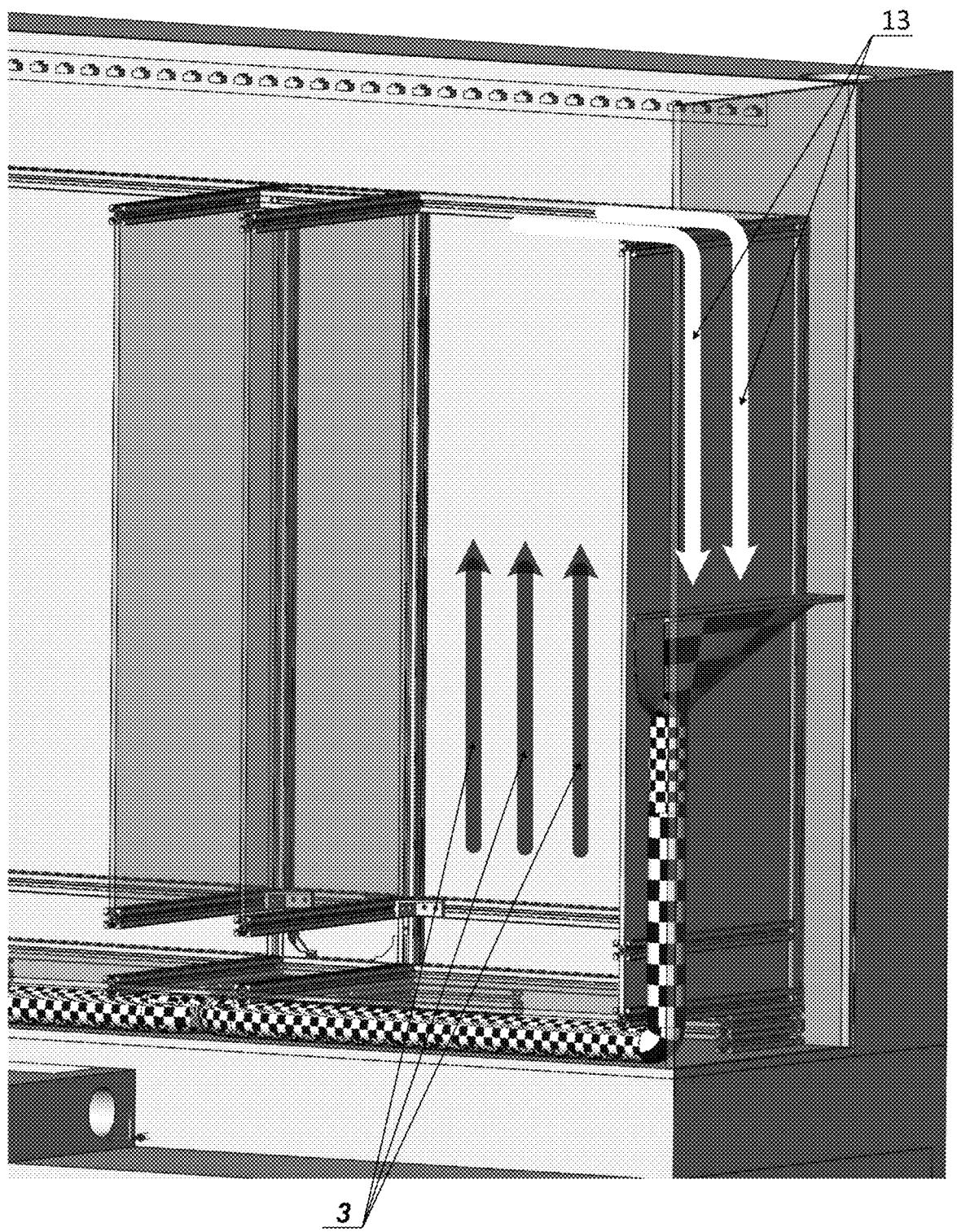
FIG. 6 a representation of a coolant flow of the direct liquid cooling system for cooling of electronic components according to the present disclosure.

As illustrated in FIG. 6, the system according to the present invention results in a circuit where the cold and heated coolant is separated and no mixing of the coolants occurs. The coolant in its initial state being at a lower temperature travels upwards and is being heated via heat transfer from the electronic components (2). When the coolant reaches the top of the rack (5), now being heated, the coolant overflows and enters the overflow zone (13) where the "heated" coolant is separated from the coolant in the initial state by the dielectric partition (4). In other words, the "cooled" coolant flows from the bottom of the reservoir (1) in the upward direction, and the "heated" coolant flows downwards from the top of the reservoir (1).

Figure 7:
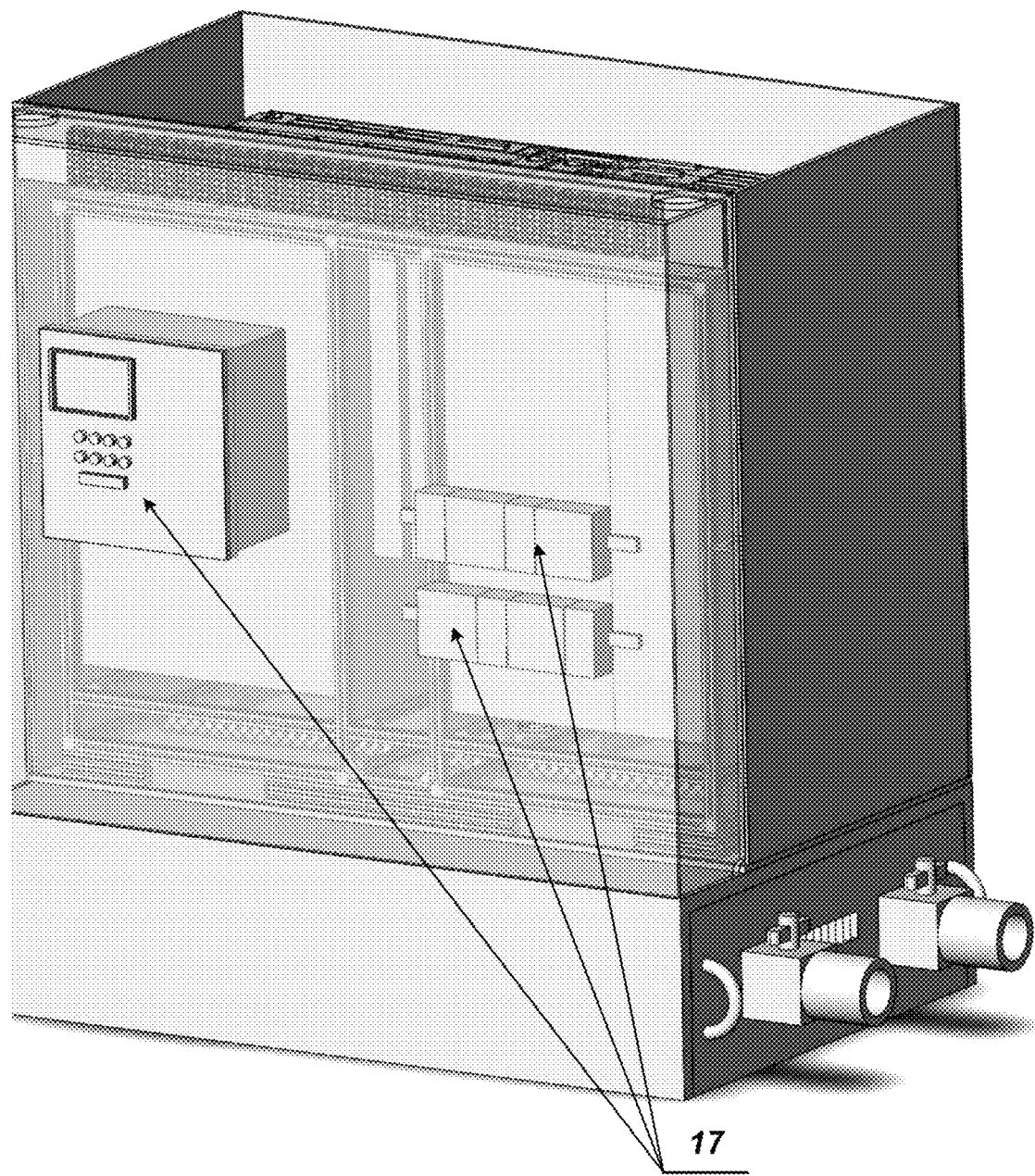
FIG. 7 a representation of a controller of the direct liquid cooling system for cooling of electronic components according to the present disclosure.

Referring to FIG. 7, according to an embodiment of the present invention, a controller (17) is adapted to monitor and control the operation of the system, such as the temperature and the flow of the dielectric fluid. Efficient operation of the system requires continuous monitoring and control of several essential operating parameters, including fluidic temperatures, pressures, conductivity at several points during circulation of the dielectric fluid described herein.

The sensory and control functions can be implemented using traditional dedicated hardware and software components. One of the objectives of the present invention is to provide the predetermined thermostable environment for the electronic components (2).

Accordingly, in one embodiment of the present invention, the number of the technical solutions is implemented in the controller (17). For example, detection and analysis of the temperature above the cooled equipment hot points by dedicated sensors (not shown), determining the temperature differences and directing the pump assembly (7) to increase or decrease the velocity of the coolant flows (3) based on the temperature data provided.

Another example is detection of the temperature of heated coolant return flows by the dedicated sensors (not shown) in a heat exchanger module (18) and/or the outlet pipeline (15), determining the temperature differences and directing the pump assembly (7) to increase or decrease the velocity of the coolant flows (3) based on the temperature data provided.

Yet another example of the controller's (17) functions is, based on the temperature changes gradient detected in the overflows zone (13) by means of the temperature sensors, direct and/or regulate the coolant volume and flow strength through mechanical or electronic-mechanical means via the nozzle (9) that is aligned with the guide opening (22) of the dielectric panel (12).

Accordingly, the system controller (17) is used control different components of the cooling system to maintain the exiting dielectric coolant temperature at an acceptable elevated temperature. By maintaining the existing coolant at an elevated level, the cooling system may be used with a number of different techniques for using or dissipating the heat (e.g., heat recapture, low power heat dissipation, or refrigeration).

Figure 8:
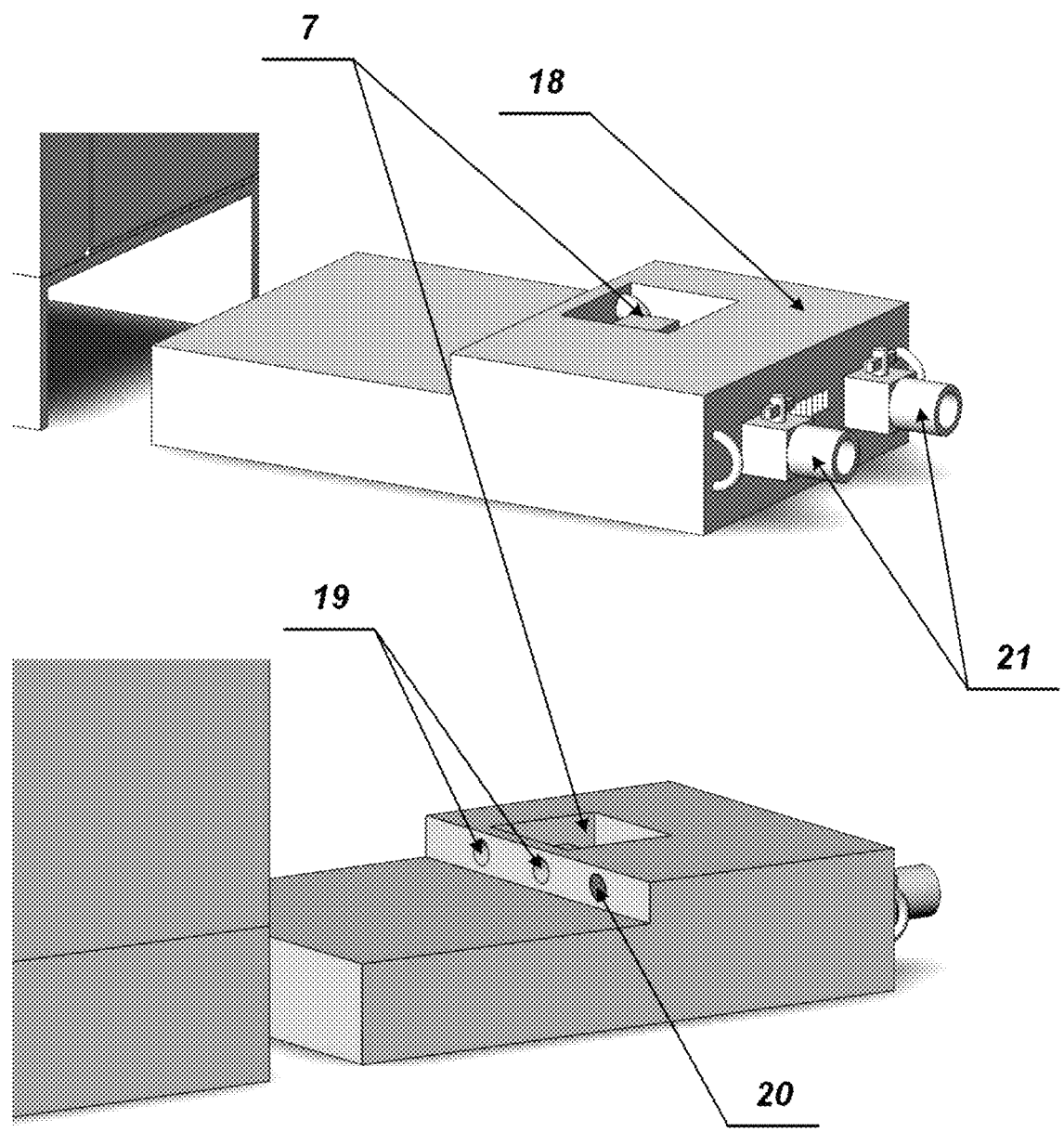
FIG. 8 a representation of a heat exchanger module of the direct liquid cooling system for cooling of electronic components according to the present disclosure.

Referring to FIG. 8, the heat exchanger (18) is connected to the reservoir (1) by means of a sealed quick-release pipe coupling connected to the pipes for direct and reverse coolant flows (19).

The heat exchanger (18) further includes combined with an electric quick-disconnect (20) for signal transmission and power electric lines. The coolant flow, via the pump assembly (7), passes through the heat exchanger (18) primary circuit transferring the heat to the second circuit. The second circuit in turn is connected by means of the sealed quick-release pipe coupling to the pipelines of the heat recovery system (21). Each of the circuits may have dedicated pump assemblies for transferring the coolant as provided herein.

In one embodiment, the heat exchanger (18) is located remotely from the reservoir (1) and includes at least one pump assembly (7). The reservoir (1) may include a pipe or line from the piping system described herein connected to the heat exchanger (18) for the flow of lower temperature or cooled liquid coolant into the reservoir (1) and another pipe or line connected to outlet pipeline (15) for the flowing or pumping of heated coolant out of the reservoir (1) to the distally located heat exchanger (18) as shown in FIG. 8.

Any of the known heat recovery systems are suitable for purposes of the present invention. Some of the known methods are cooling towers, external radiators and chiller systems.

Further, the heat recovery device can be where recovered heat is used for environmental heating. For example, the heat recovery device can be part of a building or room heating system where recovered heat is used to heat the building. Examples of thermal recovery devices include, but are not limited to, in-floor heaters and geothermal electricity generation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A direct liquid cooling system for cooling of electronic components configured to maintain a predetermined thermostable environment for the electronic components, comprising:
   a reservoir;
   a rack removably placed in the reservoir and securely containing the electronic components to be cooled, wherein the rack has an upper portion and a lower portion separated by a horizontally placed dielectric panel that has a plurality of guide openings;
   a dielectric coolant is configured to flow upward in parallel streams between the electronic components through at least one nozzle positioned at the lower portion of the rack at a bottom of the reservoir, wherein the at least one nozzle is aligned with a guide opening of the plurality of guide openings;
   a pump assembly coupled with the at least one nozzle through an inlet pipeline that facilitates continuous pumping of the dielectric coolant thereby forcing the dielectric coolant upwards through the electronic components and overflowing the dielectric coolant;
   a heat exchanger module coupled with the reservoir through an outlet pipeline, wherein the outlet pipeline is coupled with an outlet port configured to receive the dielectric coolant overflow; and
   a controller configured to monitor the temperature through temperature sensors and adjust a flow of the dielectric coolant.

2. The direct liquid cooling system of claim 1, wherein the rack further comprises dielectric partitions that are configured to provide separation of the parallel streams of the dielectric coolant and functional zones within the reservoir.

3. The direct liquid cooling system of claim 1, wherein the rack further comprises T-shaped longitudinal grooves on side surfaces of the rack in order to facilitate securing the electronic components on the rack and the dielectric partitions.

4. The direct liquid cooling system of claim 1, wherein the rack further comprises at least a single filler element in order facilitate maximum flow of the dielectric coolant and to reduce the volume of the dielectric coolant used when the rack is not fully occupied by the electronic components.

5. The direct liquid cooling system of claim 1, wherein the dielectric panel comprises of a plurality of dielectric panels.

6. The direct liquid cooling system of claim 1, wherein the controller determines the temperature difference within the system through temperature sensors and adjusts the flow of the dielectric coolant through the electronic components in order to maintain the predetermined thermostable environment of the electronic components.

7. A liquid cooling system for cooling of electronic components, comprising:
   a reservoir;
   a rack removably placed in the reservoir with the electronic components to be cooled, the rack comprises dielectric partitions that are configured to provide separation of parallel streams of a dielectric coolant and functional zones within the reservoir;
   the dielectric coolant that is configured to flow upward in the parallel streams;
   a pump assembly coupled with an at least one nozzle through an inlet pipeline that facilitates continuous pumping of the dielectric coolant via the at least one nozzle thereby forcing the dielectric coolant upwards through the dielectric partitions and overflowing the dielectric coolant into an outlet port;
   a heat exchanger module coupled with the reservoir through an outlet pipeline, wherein the outlet pipeline is coupled with the outlet port configured to receive the dielectric coolant overflow; and
   a controller configured to monitor the temperature through temperature sensors and adjust a flow of the dielectric coolant to a predetermined thermostable environment.

8. The liquid cooling system of claim 7, wherein the rack further comprises T-shaped longitudinal grooves on side surfaces of the rack in order to facilitate securing the electronic components on the rack and the dielectric partitions.

9. The liquid cooling system of claim 7, wherein the rack further comprises at least a single filler element in order facilitate maximum flow of the dielectric coolant and to reduce the volume of the dielectric coolant used when the rack is not fully occupied by the electronic components.

10. The liquid cooling system of claim 7, wherein the rack comprises an upper portion and a lower portion separated by horizontally placed dielectric panel that has a plurality of guide openings.

11. The liquid cooling system of claim 10, wherein the dielectric panel comprises of a plurality of dielectric panels.

\* \* \* \* \*